United States Patent
McKechnie et al.

(10) Patent No.: US 11,532,604 B2
(45) Date of Patent: Dec. 20, 2022

(54) PORTABLE LIGHT WITH CURVED CHIP-ON-BOARD ASSEMBLY

(71) Applicant: Knog Pty Ltd, Richmond (AU)

(72) Inventors: Malcolm McKechnie, Richmond (AU); Hugo Davidson, Richmond (AU); Chris Bilanenko, Richmond (AU); Eli Thurrowgood, Richmond (AU)

(73) Assignee: KNOG PTY LTD, Richmond (AU)

( * ) Notice: Subject to any disclaimer, the term of this patent is extended or adjusted under 35 U.S.C. 154(b) by 0 days.

(21) Appl. No.: 17/262,867

(22) PCT Filed: Jul. 30, 2019

(86) PCT No.: PCT/AU2019/050792
§ 371 (c)(1),
(2) Date: Jan. 25, 2021

(87) PCT Pub. No.: WO2020/024001
PCT Pub. Date: Feb. 6, 2020

(65) Prior Publication Data
US 2021/0242183 A1    Aug. 5, 2021

(30) Foreign Application Priority Data
Jul. 30, 2018 (AU) .............................. 2018902757

(51) Int. Cl.
*H01L 25/075* (2006.01)
*F21L 4/00* (2006.01)
(Continued)

(52) U.S. Cl.
CPC ............ *H01L 25/0753* (2013.01); *B62J 6/26* (2020.02); *F21L 4/00* (2013.01); *F21V 15/01* (2013.01);
(Continued)

(58) Field of Classification Search
CPC ................. H01L 25/0753; H01L 24/48; H01L 2224/73265; H01L 33/62; H01L 24/32;
(Continued)

(56) References Cited

U.S. PATENT DOCUMENTS 6,324,882 B1    12/2001  Kutschker et al.
9,534,750 B2 *   1/2017  Pritchett ................. F21V 5/006
(Continued)

FOREIGN PATENT DOCUMENTS

CN    206112587 U    4/2017
CN    107534051 A    1/2018
(Continued)

OTHER PUBLICATIONS

Ota_Et_Al._JP_Patent_JPH10166059_06-1998_Machine_Translation.pdf (Year: 1998).*
(Continued)

*Primary Examiner* — Tracie Y Green
(74) *Attorney, Agent, or Firm* — Christensen O'Connor Johnson Kindness PLLC

(57) ABSTRACT

The disclosure provides a portable light. The portable light includes a housing having a front surface, a rear surface, and an internal space for receiving electronic components and a battery. The portable light also includes a chip-on-board (COB) assembly. The COB assembly includes a substrate, a matrix of individual light emitting diode (LED) chips mounted to the substrate, and an outer coating covering the matrix of LED chips. The front surface of the housing is curved in one direction and the COB assembly is correspondingly curved and mounted to the front surface, such that individual LED chips are positioned about the curve and orientated to direct light outwardly about the curve to
(Continued)

provide a collective beam angle greater than 220 degrees. The portable light further includes a front lens cover to protect the COB assembly.

21 Claims, 10 Drawing Sheets

(51) Int. Cl.
| | |
|---|---|
| *F21V 21/088* | (2006.01) |
| *F21V 15/01* | (2006.01) |
| *H05K 1/18* | (2006.01) |
| *H05K 3/00* | (2006.01) |
| *B62J 6/26* | (2020.01) |
| *F21Y 107/30* | (2016.01) |
| *F21Y 115/10* | (2016.01) |
| *H01L 23/00* | (2006.01) |
| *H01L 33/62* | (2010.01) |

(52) U.S. Cl.
CPC ......... *F21V 21/0885* (2013.01); *H05K 1/189* (2013.01); *H05K 3/0014* (2013.01); *F21Y 2107/30* (2016.08); *F21Y 2115/10* (2016.08); *H01L 24/32* (2013.01); *H01L 24/48* (2013.01); *H01L 24/73* (2013.01); *H01L 33/62* (2013.01); *H01L 2224/32227* (2013.01); *H01L 2224/48227* (2013.01); *H01L 2224/73265* (2013.01); *H01L 2924/12041* (2013.01); *H05K 2201/057* (2013.01); *H05K 2201/10106* (2013.01); *H05K 2203/0195* (2013.01)

(58) Field of Classification Search
CPC . H01L 2224/32227; H01L 2924/12041; H01L 2224/48227; H01L 24/73; F21L 4/00; H05K 3/0014; H05K 1/189; H05K 2201/057; H05K 2201/10106; H05K 2203/0195; F21V 21/0885; F21V 15/01; B62J 6/26; F21Y 2115/10; F21Y 2107/30
See application file for complete search history.

(56) References Cited

U.S. PATENT DOCUMENTS

| | | | |
|---|---|---|---|
| 2013/0021811 A1* | 1/2013 | Goldwater | ........ B29C 45/14655 362/473 |
| 2013/0065353 A1 | 3/2013 | Albrecht et al. | |
| 2013/0270587 A1* | 10/2013 | Ouderkirk | ............ G02B 27/141 257/89 |
| 2015/0155453 A1* | 6/2015 | Peil | ..................... H01L 27/1446 257/100 |
| 2016/0351619 A1* | 12/2016 | Cramer | ................. H01L 27/153 |
| 2020/0072424 A1* | 3/2020 | Law | ....................... F21V 21/406 |
| 2020/0224835 A1* | 7/2020 | Grandadam | ........... H05B 45/10 |
| 2020/0408389 A1* | 12/2020 | Cacciabeve | ........... F21V 21/145 |
| 2021/0388956 A1* | 12/2021 | Wu | ......................... F21V 23/04 |

FOREIGN PATENT DOCUMENTS

| | | |
|---|---|---|
| JP | H10166059 A | 6/1998 |
| JP | 2014164976 A | 9/2014 |
| JP | 2018147662 A | 9/2018 |
| KR | 20090102489 A | 9/2009 |
| WO | 03/083811 A1 | 10/2003 |
| WO | 2016172719 A2 | 10/2016 |

OTHER PUBLICATIONS

International Search Report and Written Opinion dated Sep. 4, 2019, issued in corresponding International Application No. PCT/AU2019/050792, filed Jul. 30, 2019, 17 pages.
Extended European Search Report dated May 10, 2022, issued in corresponding European Application 19843066.2, filed Jul. 30, 2019, 6 pages.

* cited by examiner

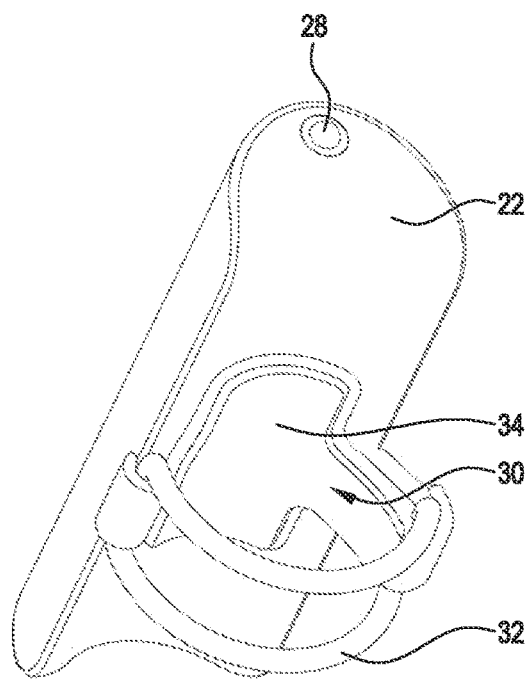
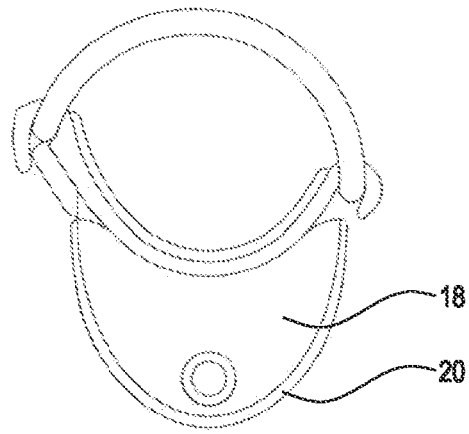
*Figure 3*
*Figure 4*
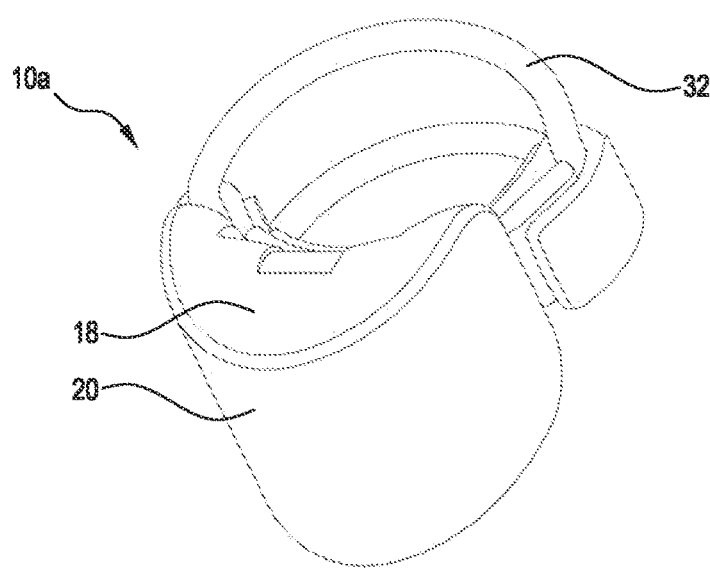
*Figure 5*

PORTABLE LIGHT WITH CURVED CHIP-ON-BOARD ASSEMBLY

FIELD OF THE INVENTION

The present invention relates to a portable light, and a method of manufacturing.

BACKGROUND OF THE INVENTION

At least in Australia, there are mandated laws that require lights to be used on bicycles when riding at night. A white light must be used on the front and a red light is to be used on the back. Each of these lights must be visible from 200 metres in front and behind, respectively. The main function of a bicycle light is to enable the rider to be seen by other road users, such as other cyclists, cars and pedestrians. For certain riding, a function of the front light is also to enable the cyclist to see ahead for obstacles.

Bicycle crashes most commonly occur at intersections and are more likely when the light is poor. Intersections can make it difficult to see bicycles, where the other road user is approaching the bicycle from their side, as many lights have a limited light beam angle.

The beam angle of a light is the angle at which light from the original source spreads or is distributed. This is typically measured from directly in front of the light source and generally can vary from 4 degrees to 60 degrees. Generally speaking, the higher the brightness of the light source, the narrower the beam angle. Conversely, a wider beam angle corresponds with lower brightness.

The beam angle can be altered with the use of lenses, which sit over the light source and refract or bend the light to widen the angle. However, such systems have limitations on how wide the beam can be widened.

The recent development of chip-on-board (COB) light emitting diode (LED) assemblies has allowed for very bright lights to be made in small housings. The reason for this is that the assembly can use a large number of LED chips on a substrate using a single circuit and only two contacts, reducing the componentry required. However, whilst the brightness can be increased by using COB LED assemblies, there is still a limitation on the beam angle. It is therefore a desired object to provide an alternative portable light that may be suitable for use on a bicycle.

Reference to any prior art in the specification is not an acknowledgment or suggestion that this prior art forms part of the common general knowledge in any jurisdiction or that this prior art could reasonably be expected to be understood, regarded as relevant, and/or combined with other pieces of prior art by a skilled person in the art.

SUMMARY OF THE INVENTION

According to a first aspect, there is provided a portable light, including:
a housing having a front surface, a rear surface and an internal space for receiving electronic components and a battery;
a chip-on-board (COB) assembly, including:
a substrate, a matrix of individual light emitting diode (LED) chips mounted to the substrate, and an outer coating covering the matrix of LED chips;
wherein the front surface is curved in one direction and the COB assembly is correspondingly curved and mounted to the front surface, such that individual LED chips are positioned about the curve and orientated to direct light outwardly about the curve to provide a collective beam angle greater than 220 degrees; and
a front lens cover to protect the COB assembly.

The collective beam angle is more preferably greater than 270 degrees.

The portable light may be a bicycle light. In such an embodiment, the rear surface of the housing may be curved to sit against a tubular frame member, such as the seat post or the head tube. Alternatively, the rear surface could be flat or slightly curved and the portable light may be used as a head torch. It will be appreciated that the present invention is not limited by the way in which the portable light is able to be used.

The rear surface may include means for mounting the light to an element. In one embodiment, the rear surface may include a mounting bracket configured to mount the light to the element. The mounting bracket may mount the light to the element by at least partially encircling the element. The mounting bracket may also include a mounting strap that at least partially encircles the element. The mounting strap may be removable or permanently attached to the housing and/or the mounting bracket. The mounting strap may be rigid or flexible. The mounting bracket and/or mounting strap may frictionally engage the element to secure the light to the element.

A USB connector may be integrated into the housing to enable charging of the battery. The USB connector may comprise a male USB connector or a female USB connector. The male USB connector may protrude from the housing. The female USB connector may be in the form of a port that extends into the housing. The USB connection may be in the form of a USB-A connector, USB-B connector, USB-C connector, mini-USB connector, micro-USB connector, or any other form of USB or charging connection.

The front lens cover is preferably curved to correspond to the curve of the front surface and COB assembly. The front lens cover may be clear or may be colour tinted. The front lens cover is intended to provide physical protection to the COB assembly and also a degree of waterproofing to the internal components. The direction of the light emission is provided by the orientation of the individual LED chips and not from any refraction caused by the front lens cover, although a minor amount of refraction by the lens covers will likely result.

The COB assembly substrate may be made from any suitable semi-conductive or thermally conducive material, for example aluminium, polymer, such as a composite-polymer, polyamide etc. The substrate may act as a heat sink. The substrate is preferably bendable, such that during manufacture the COB assembly may be bent to form the curved shape and is able to hold that shape after release. Alternatively, the substrate may be flexible and attached to the housing in order to hold the curved shape, or heat may be applied during the bending.

The COB assembly substrate will have a first surface, which may include a thermally conductive dielectric layer. A copper circuit layer may be printed on the dielectric layer. An insulative coating may then be applied over the first surface, keeping a matrix of copper pads exposed. The insulative coating may be white ceramic paint to reflect light outwards from the COB assembly first surface.

The LED chip may include a die connected to a copper pad with an electrically conductive adhesive, and a wire bond connecting the die to an adjacent copper pad. Alternatively, the LED chip may be a non-wire package, known as a flip chip package, whereby the electrical contacts are on the base of the chip and connect directly to the copper pad via solder. Further alternatively, the LED chip may be any other form of LED component, including a surface mounted (or SMT) LED chip, or any other fully encapsulated or self-contained LED component that is mounted to the substrate. A printed circuit board (PCB) may be electrically connected to the COB assembly at an edge of the COB assembly or via one or more openings, notches, or slots in the COB assembly.

For a white LED die, a yellow phosphor layer may be applied over the top of the first surface before the outer coating is applied. The outer coating may be a clear silicone layer; alternatively the silicone may be tinted. It will be appreciated that alternative suitable materials may be used for all components.

The curve direction is preferably perpendicular to the direction of the wire bond so that the wire does not bend. For example, when the portable light is in use in one embodiment, the wire bond may extend vertically and the curve extends around a horizontal sweep. The curve may be a parametric curve.

The physical bend extends about an angle of 90 degrees up to 360 degrees. More preferably, the bend extends between 120 degrees and 220 degrees, most preferably 180 degrees.

According to a second aspect, there is provided a portable light, including:

a housing defining a space for receiving electronic components and a battery;

a chip-on-board (COB) assembly, including:

a substrate, a plurality of individual light emitting diodes (LEDs) mounted to the substrate, and an outer coating covering the plurality of LEDs;

wherein the COB assembly is curved and located within the housing, such that individual LEDs are positioned about the curve and orientated to direct light outwardly about the curve to provide a collective beam angle greater than 220 degrees; and a front lens cover to protect the COB assembly.

The collective beam angle is more preferably greater than 270 degrees.

The front lens cover may be mounted to the housing. The COB assembly may be mounted to the housing. The housing may include a curved surface that is similar in curvature to the COB assembly.

The portable light according to the second aspect may include any one or more of the features described above in relation to the portable light according to the first aspect.

According to a third aspect, there is provided a device for bending a chip-on-board (COB) assembly, including:

a guide having a first surface for holding a flat COB assembly with the first side of the COB assembly being positioned outwardly with respect to the guide surface;

two opposing actuators movable inwardly towards each other;

two opposing clamping devices, each pivotally attached to an inner end of a respective actuator, the clamping devices configured to clamp opposing peripheral edges of a COB assembly positioned in the guide;

a forming die located under or behind the guide such that the COB assembly is positioned above or in front of the forming die, the forming die having a curved engagement surface;

whereby the forming die can be actuated to push against the second side of the COB assembly bending the COB assembly centrally in a first direction, whereby the actuators move inwardly with the clamped edges of the COB assembly as it bends, with the clamping devices rotating as the edges move.

According to a fourth aspect, there is provided a method of bending a chip-on-board (COB) assembly, the COB assembly having a substrate with a matrix of individual light emitting diodes (LED) chips mounted to a first surface, the method including:

placing at least one COB assembly into a guide with the first surface positioned to face outwardly in a first direction;

clamping two opposing peripheral edges in respective clamping devices;

actuating a forming die having a curved engagement surface, the forming die moving the engaging surface towards the second surface of the COB assembly in the first direction to bend the COB assembly such that the COB assembly takes the shape of the engagement surface;

whereby, as the forming die pushes against the second surface, the clamping devices move inwardly towards each other and pivot towards the first direction to follow the edges of the COB assembly as it is bent.

Advantageously, the movement of the actuators, the clamping device and the forming die follow a pre-defined sequence and timed movement.

The guide positions the COB assembly with opposing peripheral edges adjacent to the clamping devices, whereby the actuators are programmed to move inwardly a set distance whilst jaws of the clamping device are open to position the jaws on the first and second sides of the opposing edges, the jaws are then closed to clamp the COB assembly.

The COB assembly may then be released from the clamping device and transferred to another station that trims the opposing peripheral edges of the substrate.

In one embodiment, the COB assembly is a plurality of spaced apart COB assemblies, integrally formed from a single substrate sheet, whereby the trimming of the opposing peripheral edges separates the individual COB assemblies.

The method of bending ensures that the first surface of the COB assembly is not touched by the bending device.

An individual COB assembly may be assembled into the portable light of the first aspect of the invention.

Further aspects of the present invention and further embodiments of the aspects described in the preceding paragraphs will become apparent from the following description, given by way of example and with reference to the accompanying drawings.

BRIEF DESCRIPTION OF THE DRAWINGS

FIG. 3 shows a rear perspective view of the portable light of FIG. 2 with a bicycle mount;

FIG. 4 shows a top view of the portable light of FIG. 3;

FIG. 5 shows an alternative embodiment of the portable light of smaller size;

DETAILED DESCRIPTION OF THE EMBODIMENTS

Figure 1:
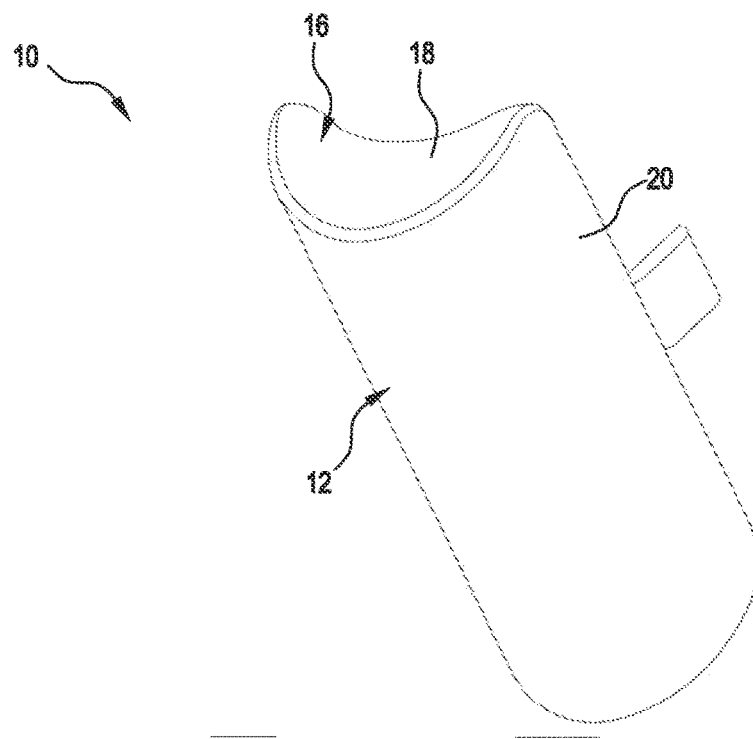
FIG. 1 shows a front perspective view of a portable light according an embodiment of the invention.
Figure 2:
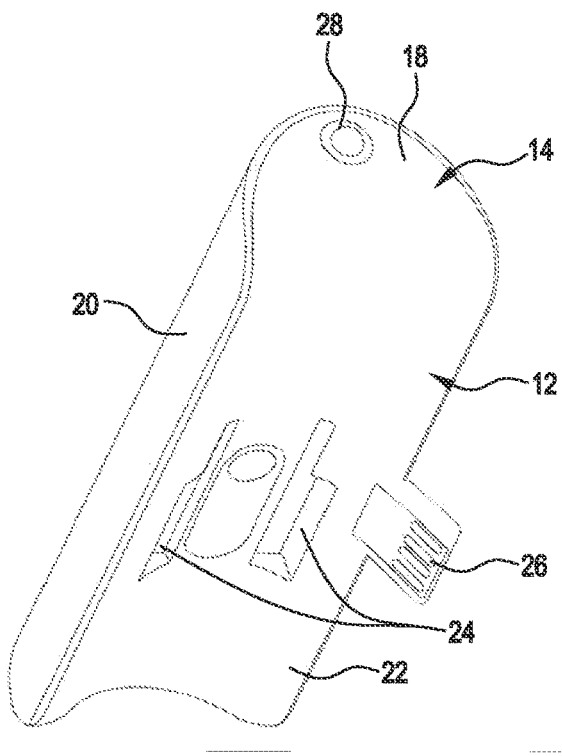
FIG. 2 shows a rear perspective view of the portable light of FIG. 1.

FIGS. 1 and 2 show a portable light 10 having a front 12, a rear 14, a top 14 and a bottom 16, when used in an upright orientation. The light has a housing 18 and a lens cover 20 that has a curved surface running from side to side, with the surface being straight up and down.

The rear surface 22 of the housing is curved to sit against a tubular object, such as a bicycle frame. The rear surface also includes formations in the form of two spaced apart parallel slots 24 to allow for the connection of a mounting bracket, to be described below. The housing 18 also includes a USB connector 26 for charging the internal battery, and a button 28. The button 28 can be used to turn the light on and off, and also to cycle between modes, such as flashing or constant.

As can be seen in FIG. 3, a mounting bracket 30 can be removably connected to the rear surface 22. The mounting bracket includes a silicone strap 32 that can be wrapped around a tubular frame. A mounting pad 34, also made from silicone, can be adhered to the surface of the mounting bracket 30. The mounting pad assists in protecting the tubular frame and provides friction to prevent the light from sliding.

FIG. 4 is a plan view of the light, which illustrates the curve of the front lens cover 20 and the corresponding curve of the front of the housing. The curve extends around an angle of 180 degrees and is parametric in shape. However, it will be appreciated that the present invention may be used with a bend greater or less than 180 degrees, generally in the range of 90 degrees to 360 degrees.

As shown in FIG. 5, the light 10a may be provided in different sizes. Light 10a is the same as light 10 in all respects, except it is shorter.

Figure 6:
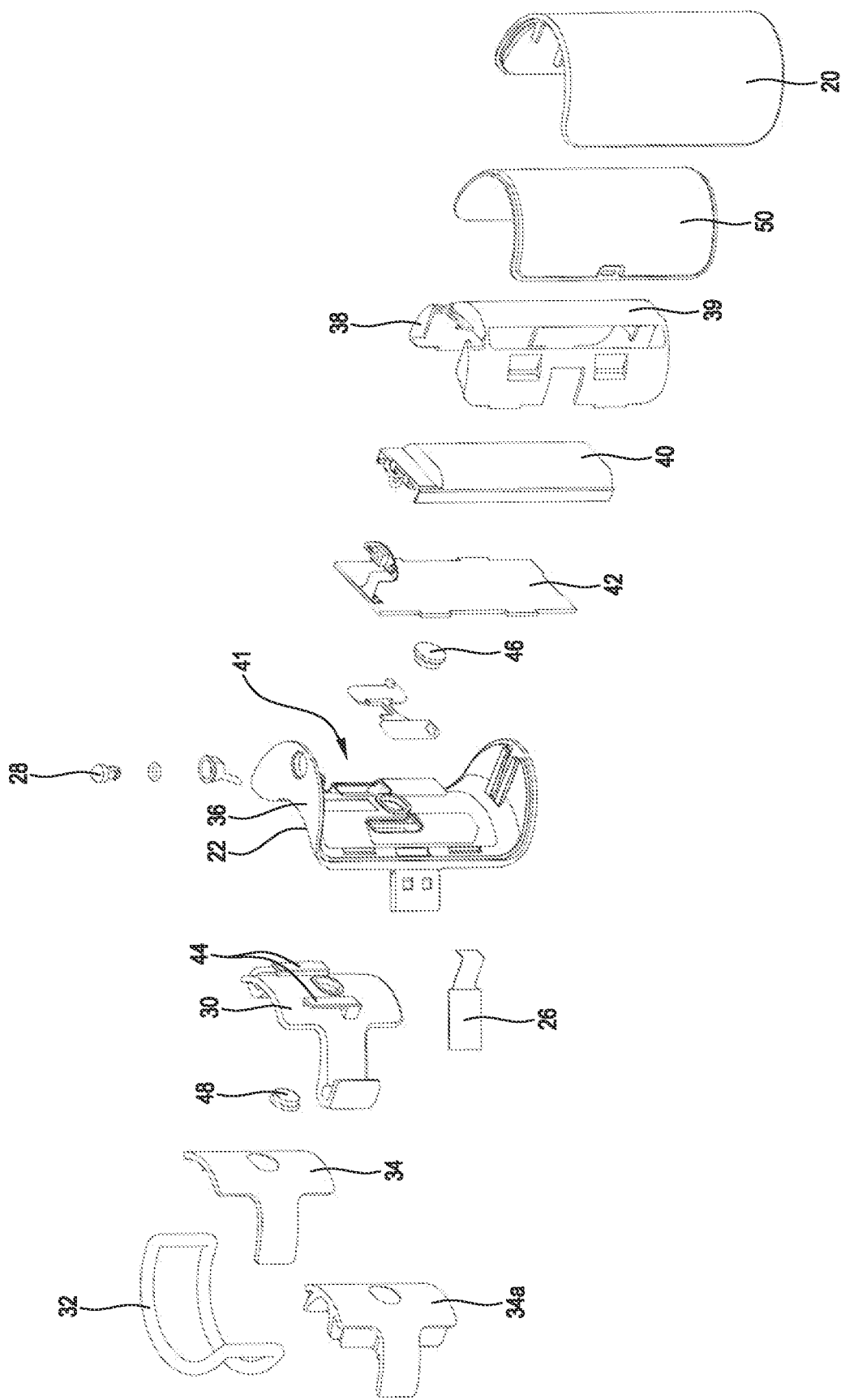
FIG. 6 shows an exploded view of the portable light of FIG. 3.

FIG. 6 is an exploded view of the light assembly. The housing 18 is constructed from a rear body 36 and a front body 38. When the two bodies are coupled together they create an internal space 41 for receiving a battery 40 and a printed circuit board (PCB) 42. The rear body 36 includes the rear curved surface 22 with slots 24. The mounting bracket 30 has two spaced apart rails 44 that slide into slots 24. Embedded in an aperture in the rear surface 22 is a first magnet 46. A second magnet 48 is embedded in an aperture in the mounting bracket 30, such that when the mounting bracket is slid onto the rear surface, the two magnets engage to strengthen the connection, whilst making the mounting bracket readily removable.

FIG. 6 illustrates two alternative mounting pads 34, 34a. Mounting pad 34a has a different rear profile to provide a smaller curved surface for fitting onto a smaller diameter tubular object.

Figure 7:
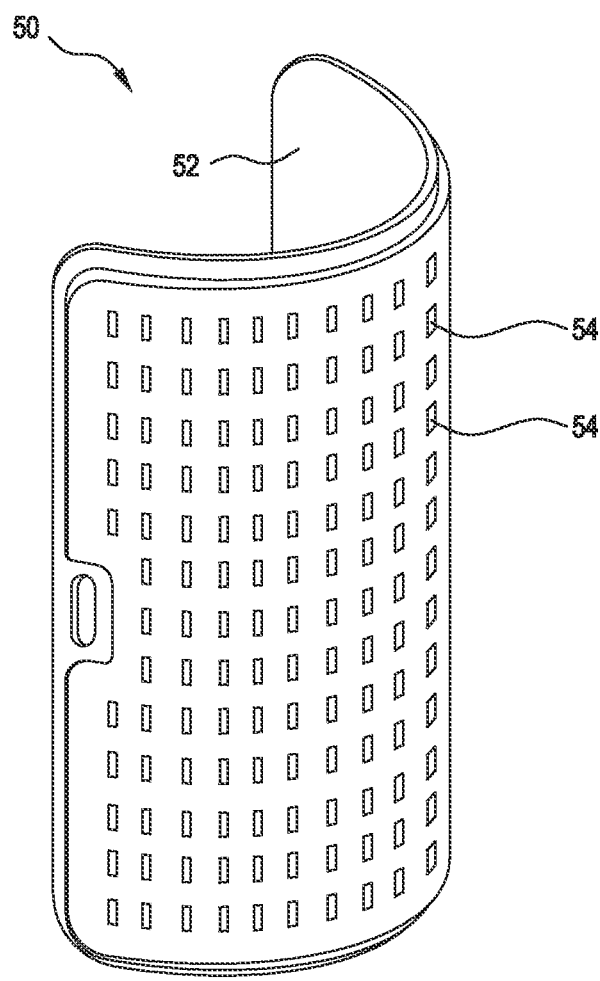
FIG. 7 shows a chip-on-board (COB) assembly according to an embodiment of the invention.

The front body 38 has a front surface 39 that is curved in one direction, being sideways, corresponding to the curve of the front lens, as discussed above. Positioned between the front body 38 and the front lens cover 20 is a chip-on-board assembly 50, which is shown in greater detail in FIG. 7.

Figure 8:
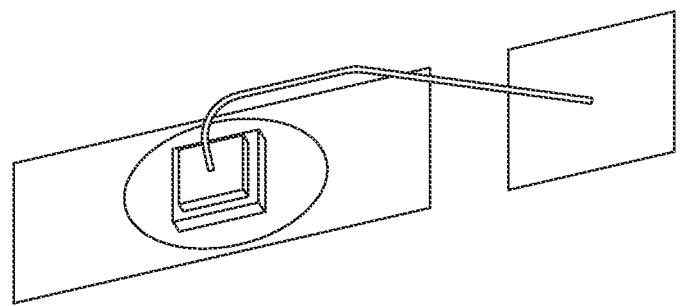
FIG. 8 shows a magnified view of a light emitting diode (LED) chip according to a first embodiment.
Figure 9:
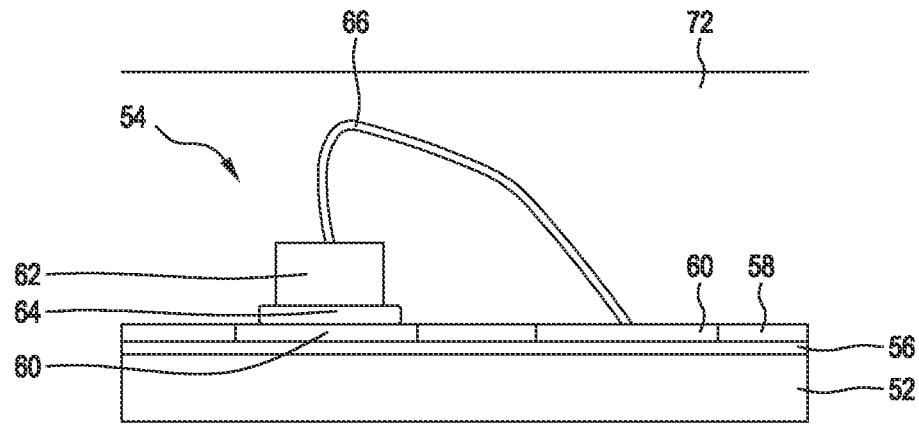
FIG. 9 shows a side view of a LED chip according to a second embodiment.
Figure 10:
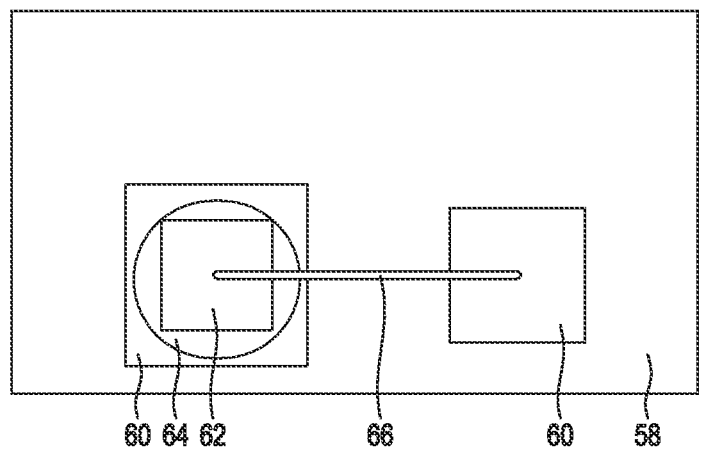
FIG. 10 shows a top view of the LED chip of FIG. 9.

The chip-on-board assembly, commonly known as a COB assembly, includes a substrate 52 made from a semi-conductive material, for example aluminium or selective polymers. The substrate may be thermally conductive to act as a heat sink. Mounted to a first surface of the substrate is a matrix of light emitting diode (LED) chips 54. The matrix of chips 54 are generally arranged in columns and rows, although this may be varied. The type of chips 54 may also vary. FIGS. 8-10 show a wire bonded LED chip. The substrate 52 in this embodiment is aluminium, which has a thermally conductive dielectric layer 56 on the first surface. A copper circuit layer is then added over layer 56. A solder mask layer 58 is then applied covering the majority of the surface, whilst leaving areas of the copper circuit layer exposed to form copper pads 60. The solder mask layer 58 is preferably white ceramic paint. A die 62 is attached to a copper pad 60 using electrically conductive adhesive 64 and is then connected to another copper pad 60 using a wire bond 66. The direction of all of the wire bonds 66 in a matrix are orientated to run in the same direction. This direction is vertical in this embodiment, allowing the COB assembly to be bent in the horizontal direction without breaking any of the wire bonds, which are highly fragile. Wire bonded LED chips are often used for red LEDs.

Figure 11:
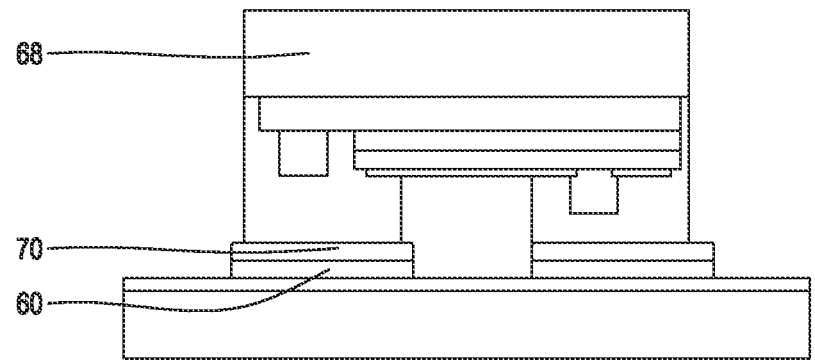
FIG. 11 shows a side view of a LED chip according to a third embodiment.
Figure 12:
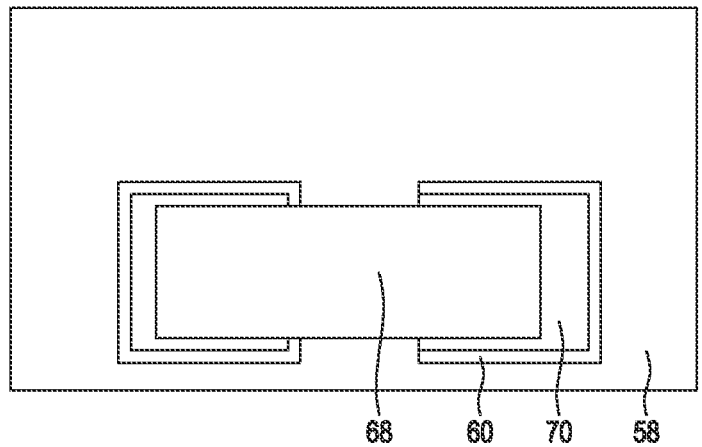
FIG. 12 shows a top view of the LED chip of FIG. 11.

Another LED chip is shown in FIGS. 11 and 12, which is a white flip chip. In this embodiment, the substrate and layers are the same as the first embodiment it is only the LED chip that differs. The flip chip package 68 is bonded to the copper pads 60 by solder 70. Similar to the wire bonded LED chips, the orientation is such that the flip chip packages 68 all run in the same direction, being perpendicular to the direction of bending.

Over the top of the LED chips is an outer coating 72 (shown in FIG. 9 only) of silicone to protect the assembly, although the LED chips are still quite fragile and pressure applied to them may cause damage.

Turning back to FIG. 6, the bent COB assembly is placed over the curved front surface of the housing, providing support. Two leads (not shown) from the PCB extend through a gap in the front body 38 and are soldered to the two contacts on the edge of the COB assembly. The lens cover 20 is then placed over the front to enclose the light and provide protection to the COB assembly.

The curved COB assembly positions multiple LEDs about the curve so that they are orientated to direct light outwardly about the curve. The design means that individual LEDs are projecting a beam in a straight direction, in a sideways direction and at acute angles in between. The result of this is a collective beam angle of approximately 300 degrees. The increased beam angle created this way does not require an optic lens to bend the light, so the illumination remains bright. When the light is attached to a bicycle frame the visibility of a rider to other road users is greatly increased, as the light is clearly projecting sideways in both directions and at all angles in between.

The fragility of the LED chips means that bending the COB assembly without damaging any of the LED chips is complicated. A unique device and method has been developed to produce the curved COB assembly for use in the portable light.

Figure 13:
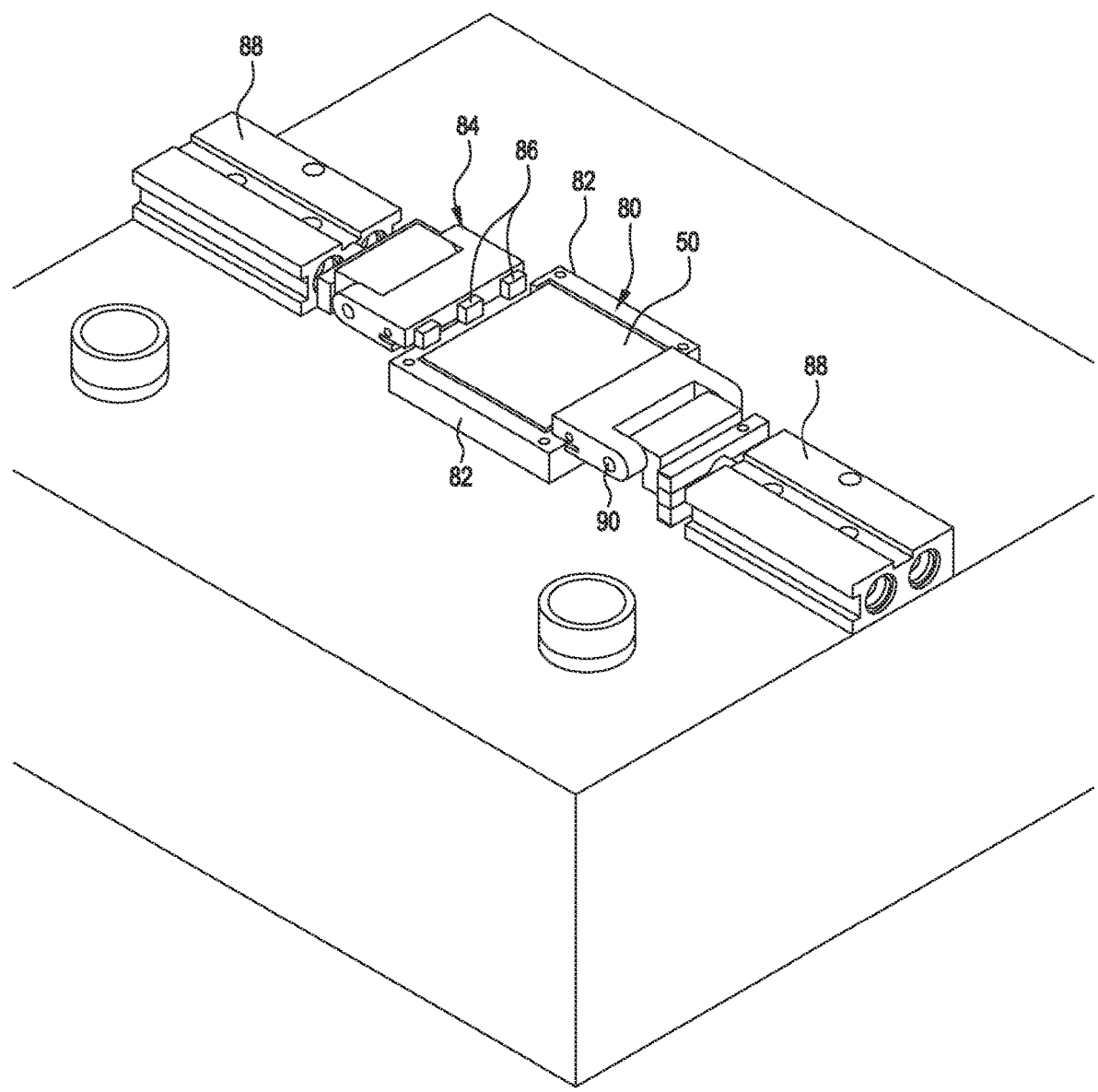
FIG. 13 shows a device for bending a COB assembly according to an embodiment.
Figure 14:
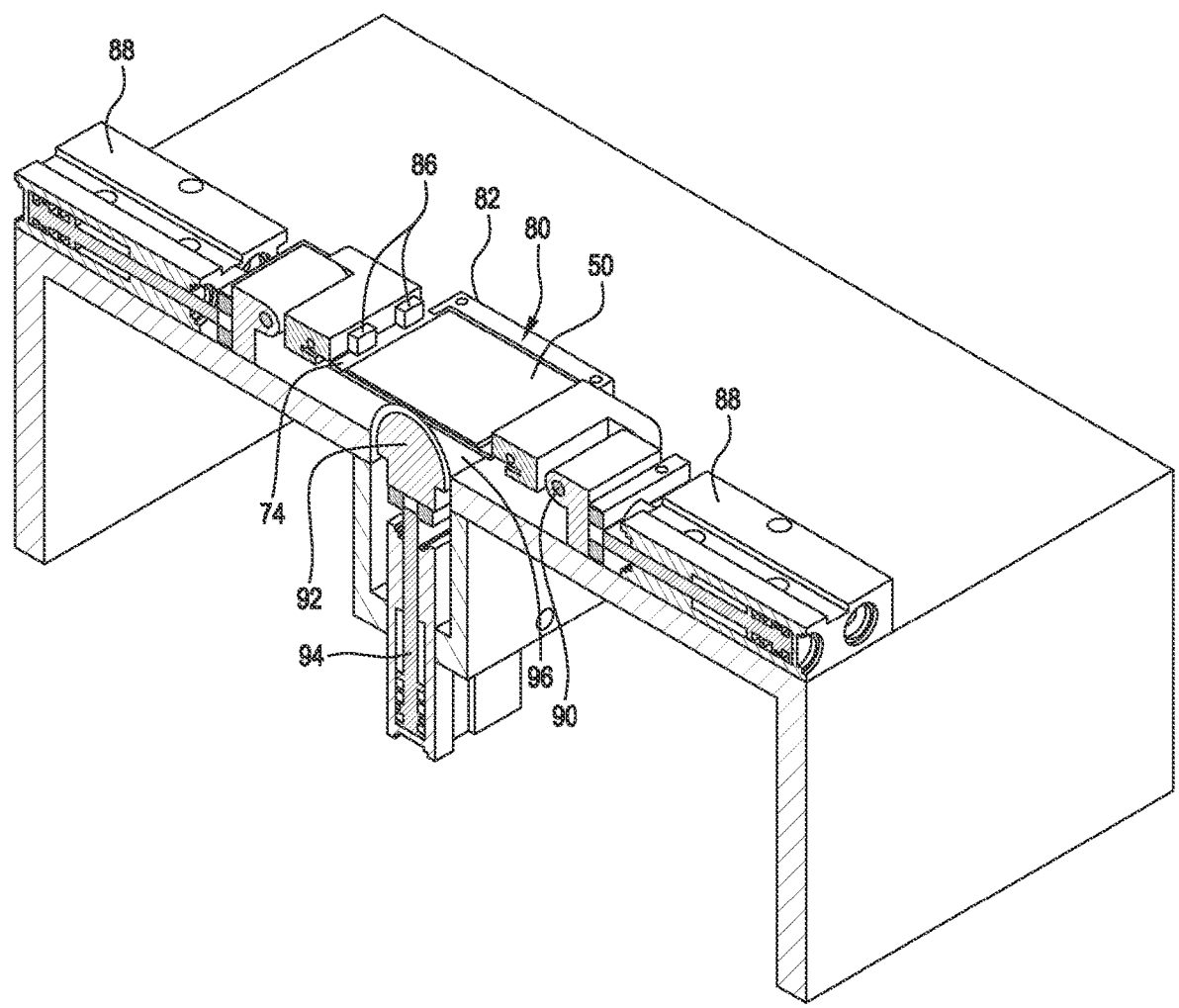
FIG. 14 is a cross-sectional view of the device of FIG. 13.

The COB assembly is manufactured flat and has substrate salvage incorporated into two opposing peripheral edges 74 to assist in handling the assembly without contacting the components. FIGS. 13 and 14 show a device for bending a COB assembly. It includes a guide 80 with two stepped spaced apart supports 82 with upwardly facing surfaces onto which the flat COB assembly can be placed. The guide is sized and shaped to position the COB assembly with its first surface upwards and its salvage edges 74 sideways.

Two opposing clamping devices 84 are positioned to either side of the guide 80. The clamping devices 84 include one or more jaws 86 that clamp onto the salvage edges 74. The clamping devices are pivotally attached to the end of horizontal linear actuators 88 via rotation pins 90.

Below the guide 80 and COB assembly 50 is a forming die 92 (see FIG. 14) attached to the end of a vertical linear actuator 94. The forming die 92 has a curved engagement surface 96 that comes into contact with the second side of the COB assembly when raised. The curved engagement surface corresponds to the desired curve for the portable light.

In operation, a flat COB assembly 50 is placed onto the guide 50 and the actuators 88 are programmed to move inwards slightly to position the open jaws 86 over the salvage edges 74. The jaws then shut, clamping the edges. The vertical actuator 94 pushes the forming die 92 upwards into the second side of the COB assembly, bending the substrate from the centre. To allow the substrate to bend, the horizontal actuators 88 also move inwardly as the substrate bends and the clamping devices 84 are able to freely rotate to follow the bending. This movement is illustrated in FIGS. 15a-15d and 16. The movement of the actuators may all be pre-programmed to ensure correct tension is maintained during bending.

Figure 15A:
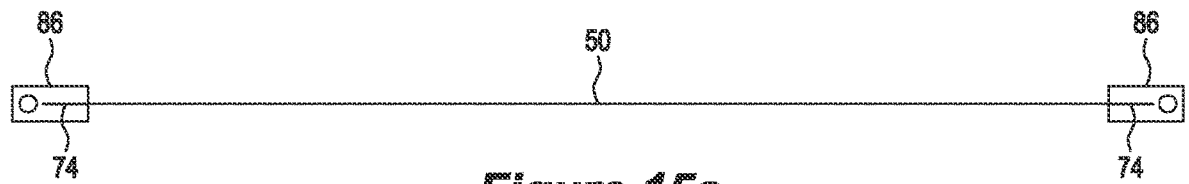
FIGS. 15a through 15d show the stages of a COB assembly being bent.
Figure 15B:
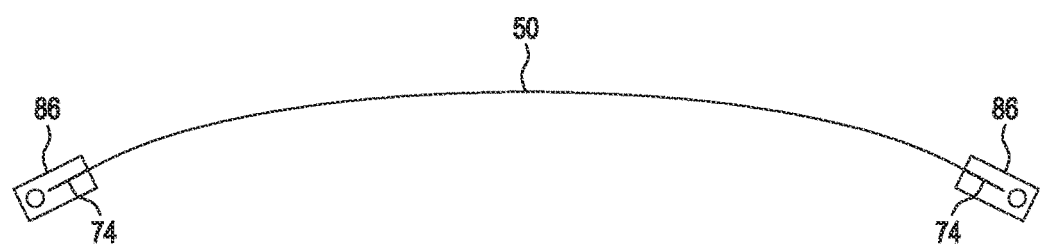
Figure 15C:
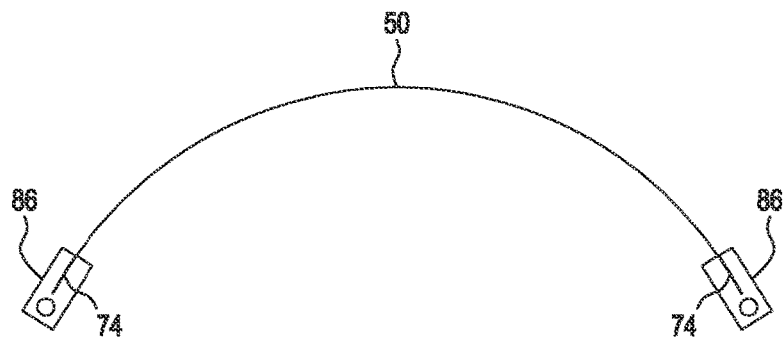
Figure 15D:
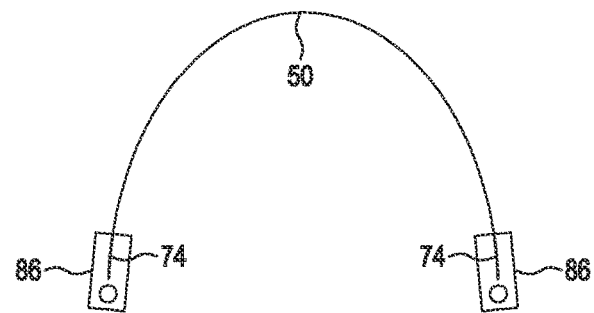
Figure 16:
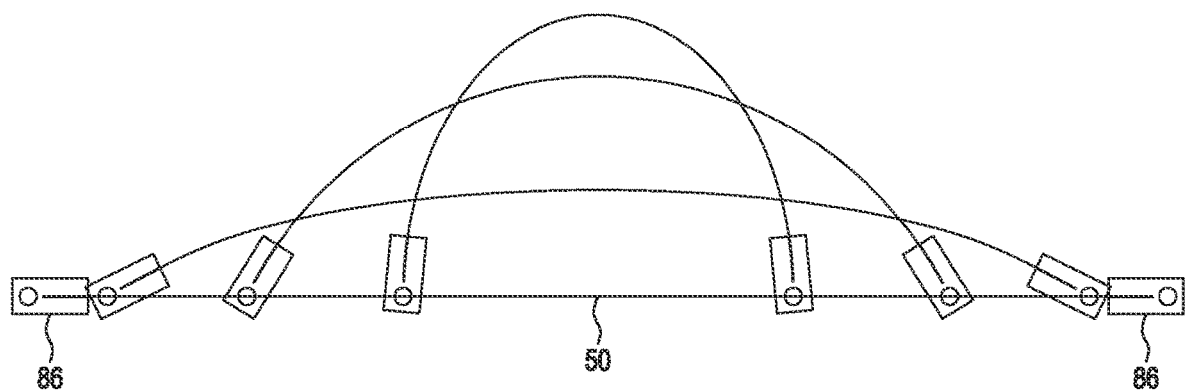
FIG. 16 shows a COB assembly being progressively bent.

As can be seen in FIG. 15a, the jaws 86 are clamped onto the salvage edges 74 of the flat COB assembly. As the forming die presses against the centre of the substrate, the substrate starts to bend upwardly. To allow the bending, the edges need to move inwardly and rotate, as successively shown in FIGS. 15b-15d and FIG. 16.

Following the bending process, the COB assembly is released from the jaws 86 and removed from the device. The salvage edges 74 are then trimmed off.

Figure 17:
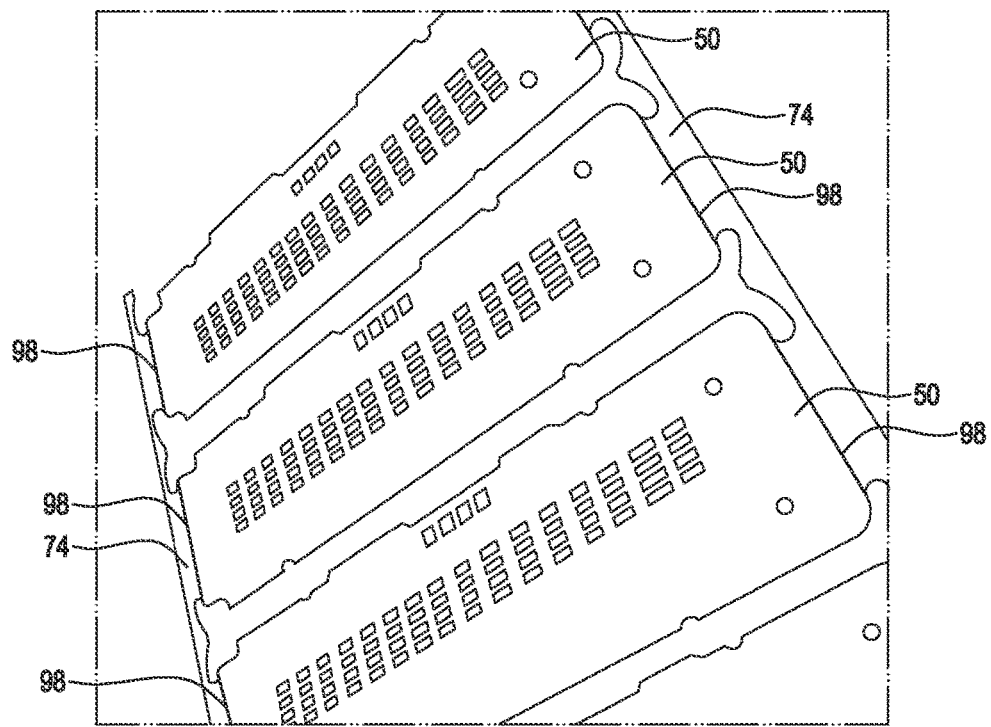
FIG. 17 shows an integral strip of COB assemblies.

The device and bending process is suitable for forming individual COB assemblies. However, it can also be adapted to bend multiple COB assemblies simultaneously. As shown in FIG. 17, multiple COB assemblies can be made using an integral substrate, whereby they are joined together by common salvage edges 74. After the bending process is completed, the salvage edges 74 can be sliced off along lines 98.

The bending process and method allows for the fragile COB assemblies to be bent to form a curved shape, without any contact being made with the first surface where the LED chips are located.

It will be understood that the invention disclosed and defined in this specification extends to all alternative combinations of two or more of the individual features mentioned or evident from the text or drawings. All of these different combinations constitute various alternative aspects of the invention.

The invention claimed is:

1. A portable light, including:
    a housing having a front surface, a rear surface, and an internal space for receiving electronic components and a battery;
    a chip-on-board (COB) assembly, including:
        a substrate, a two or more rows and two or more columns of individual light emitting diode (LED) chips mounted to the substrate to form a matrix of LED chips on the substrate, and an outer coating covering the matrix of LED chips;
    wherein the front surface is curved in one direction and the substrate is correspondingly curved and mounted to the front surface, such that individual LED chips are positioned about the curve and orientated to direct light outwardly about the curve to provide a collective beam angle greater than 220 degrees; and
    a front lens cover to protect the COB assembly.

2. The portable light of claim 1, wherein the collective beam angle is greater than 270 degrees.

3. The portable light of claim 1, further including a mount for mounting the portable light to an element.

4. The portable light of claim 1, further including a USB connector configured to enable charging of the battery.

5. The portable light of claim 1, wherein the front lens cover is curved to correspond to the curve of the front surface and substrate.

6. The portable light of claim 1, wherein the front lens cover is configured to protect the COB assembly from damage or malfunction due to water.

7. The portable light of claim 1, wherein the COB assembly comprises a semi-conductive or thermally-conductive material, and wherein the substrate is configured to act as a heat sink.

8. The portable light of claim 1, wherein the substrate is resiliently bendable so as to form and maintain the curved shape.

9. The portable light of claim 1, wherein the substrate is flexible so as to be configured to form the curved shape.

10. The portable light of claim 1, wherein the substrate includes a first surface that includes a thermally conductive dielectric layer, wherein a copper circuit layer is located on the dielectric layer, and wherein an insulating coating is applied over the first surface such that a matrix of copper pads of the copper circuit layer is exposed.

11. The portable light of claim 10, wherein each of the LED chips include a die connected to a respective copper pad with an electrically conductive adhesive, and wherein a wire bond connects the die to an adjacent copper pad.

12. The portable light of claim 11, wherein the curve of the substrate is generally perpendicular to the direction of the wire bond so that the wire bond is not caused to bend.

13. The portable light of claim 10, wherein each of the LED chips include one or more electrical contacts on a base of the LED chip configured to connect directly to a respective copper pad via solder.

14. The portable light of claim 1, wherein the curve of the front surface and substrate is such that it extends about an angle of between 90 degrees and 360 degrees.

15. The portable light of claim 14, wherein the curve of the front surface and substrate is such that it extends about an angle of between 120 degrees and 220 degrees.

16. The portable light of claim 1, wherein the curve of the front surface and substrate extends about an angle of approximately 180 degrees.

17. The portable light of claim 1, wherein the rear surface is generally curved so as to be configured to sit against a tubular frame member of a bicycle.

18. The portable light of claim 1, wherein the rear surface is substantially flat.

19. A portable light, including:
    a housing defining a space for receiving electronic components and a battery;
    a chip-on-board (COB) assembly, including:
        a substrate, a plurality of individual light emitting diodes (LEDs) mounted to the substrate to form a matrix of columns and rows of LEDs on the substrate, and an outer coating covering the plurality of LEDs;

wherein the substrate is curved and located within the housing, such that individual LEDs are positioned about the curve and orientated to direct light outwardly about the curve to provide a collective beam angle greater than 220 degrees; and a front lens cover to protect the COB assembly.

20. A device for bending a chip-on-board (COB) assembly, including:

- a guide having a first surface for holding a flat COB assembly with a first side of the COB assembly being positioned outwardly with respect to the guide first surface;
- two opposing actuators movable inwardly towards each other;
- two opposing clamping devices, each pivotally attached to an inner end of a respective one of the two opposing actuators, the clamping devices configured to clamp opposing peripheral edges of the COB assembly positioned in the guide;
- a forming die located under or behind the guide such that the COB assembly is positioned above or in front of the forming die, the forming die having a curved engagement surface;

whereby the forming die can be actuated to push against a second side of the COB assembly bending the COB assembly centrally in a first direction, whereby the actuators move inwardly with the clamped edges of the COB assembly as it bends, with the clamping devices rotating as the edges move.

21. A method of bending a chip-on-board (COB) assembly, the COB assembly having a substrate with a matrix of individual light emitting diodes (LED) chips mounted to a first surface, the method including:

- placing at least one COB assembly into a guide with the first surface positioned to face outwardly in a first direction;
- clamping two opposing peripheral edges in respective clamping devices;
- actuating a forming die having a curved engagement surface, the forming die moving the engaging surface towards the second surface of the COB assembly in the first direction to bend the COB assembly such that the COB assembly takes the shape of the engagement surface;
- whereby, as the forming die pushes against the second surface, the clamping devices move inwardly towards each other and pivot towards the first direction to follow the edges of the COB assembly as it is bent.

* * * * *